(12) United States Patent
Suzuki et al.

(10) Patent No.: US 12,298,495 B2
(45) Date of Patent: May 13, 2025

(54) OPTICAL SCANNING APPARATUS

(71) Applicant: DENSO CORPORATION, Kariya (JP)

(72) Inventors: Hidemasa Suzuki, Kariya (JP);
Kunihiko Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 799 days.

(21) Appl. No.: 17/374,148

(22) Filed: Jul. 13, 2021

(65) Prior Publication Data

US 2021/0341730 A1 Nov. 4, 2021

Related U.S. Application Data

(63) Continuation of application No. PCT/JP2020/000725, filed on Jan. 10, 2020.

(30) Foreign Application Priority Data

Jan. 15, 2019 (JP) .................. 2019-004373

(51) Int. Cl.
*G02B 26/10* (2006.01)
*G01S 7/481* (2006.01)
(Continued)

(52) U.S. Cl.
CPC .......... *G02B 26/105* (2013.01); *G01S 7/4817* (2013.01); *G02B 26/0816* (2013.01); *G01S 7/4811* (2013.01); *G01S 17/08* (2013.01)

(58) Field of Classification Search
CPC ...... G02B 26/10; G02B 26/12; G02B 26/105; G02B 26/0816; G02B 26/00; G02B 26/08;
(Continued)

(56) References Cited

U.S. PATENT DOCUMENTS

2005/0254101 A1* 11/2005 Chen .................. G02B 27/0018
358/474
2015/0055203 A1* 2/2015 Maruyama .......... G02B 26/105
359/213.1
(Continued)

FOREIGN PATENT DOCUMENTS

JP 61-102620 A 5/1986
JP H11264952 A * 9/1999 ............. G02B 26/12
(Continued)

*Primary Examiner* — Jyotsna V Dabbi
(74) *Attorney, Agent, or Firm* — Maschoff Brennan

(57) ABSTRACT

In an optical scanning apparatus, a light-emitting unit emits light waves. A light-receiving unit receives reflected light of the light waves. A transmissive member transmits the light waves and the reflected light of the light waves. A reflection mirror is arranged further toward the light-emitting unit side and light-receiving unit side than the transmissive member is, includes a reflection surface that rotates, and deflects at least either of the light waves and the reflected light using the reflection surface. The reflection mirror includes a low reflection region on the transmissive member side. The low reflection region has a reflectance of the light waves on the reflection surface that is set to be lower than a reflectance of the light waves on the other region other than the low reflection region, in a state in which the reflection surface is facing the light-emitting unit side or the light-receiving unit side.

15 Claims, 10 Drawing Sheets

(51) Int. Cl.
*G02B 26/08* (2006.01)
*G01S 17/08* (2006.01)

(58) Field of Classification Search
CPC ........ G02B 5/08; G02B 5/0816; G02B 5/085;
G02B 5/0858; G02B 27/0031; G02B
27/0018; G01S 7/4817; G01S 7/4811;
G01S 7/4814; G01S 7/4816; G01S 7/499;
G01S 17/08; G01S 17/42; G01S 17/48;
G01S 7/4813; G01S 17/931; B81B 3/00
USPC ....................................................... 359/224.1
See application file for complete search history.

(56) References Cited

U.S. PATENT DOCUMENTS

| | | | |
|---|---|---|---|
| 2016/0011311 A1 | 1/2016 | Mushimoto et al. | |
| 2021/0396874 A1* | 12/2021 | Uchimura | G01S 17/04 |
| 2024/0305892 A1* | 9/2024 | Bleads | G01C 21/3852 |

FOREIGN PATENT DOCUMENTS

| | | | | |
|---|---|---|---|---|
| JP | 2001012943 A | * | 1/2001 | ............. G01S 17/10 |
| JP | 2010-145486 A | | 7/2010 | |
| JP | 2016-20831 A | | 2/2016 | |

* cited by examiner

OPTICAL SCANNING APPARATUS

CROSS-REFERENCE TO RELATED APPLICATIONS

The present application is a continuation application of International Application No. PCT/JP2020/000725, filed on Jan. 10, 2020, which claims priority to Japanese Patent Application No. 2019-004373, filed on Jan. 15, 2019. The contents of these applications are incorporated herein by reference in their entirety.

BACKGROUND

Technical Field

The present disclosure relates to an optical scanning apparatus that is configured to scan light waves.

Related Art

An optical scanning apparatus that scans light waves inside a printer is known. In this optical scanning apparatus, a reflectance in a region of a reflection mirror that is not used for scanning of the light waves is set to be low to suppress unnecessary light from being reflected by the reflection mirror.

SUMMARY

An aspect of the present disclosure provides an optical scanning apparatus that scans light waves. The optical scanning apparatus includes a light-emitting unit, a light-receiving unit, a transmissive member, and at least one reflection mirror. The light-emitting unit emits light waves. The light-receiving unit receives reflected light of the light waves. The transmissive member is configured to transmit the light waves and the reflected light of the light waves. The at least one reflection mirror is arranged further toward the light-emitting unit side and light-receiving unit side than the transmissive member is. The at least one reflection mirror includes at least one reflection surface that rotates. The at least one reflection mirror deflects at least either of the light waves and the reflected light using the reflection surface. The reflection mirror has a low reflection region on the transmissive member side of the reflection surface. The low reflection region has a reflectance of the light waves on the reflection surface that is set to be lower than a reflectance of the light waves on the other region other than the low reflection region of the reflection surface, in a state in which the reflection surface is facing the light-emitting unit side or the light-receiving unit side.

DESCRIPTION OF THE EMBODIMENTS

Figure 1:
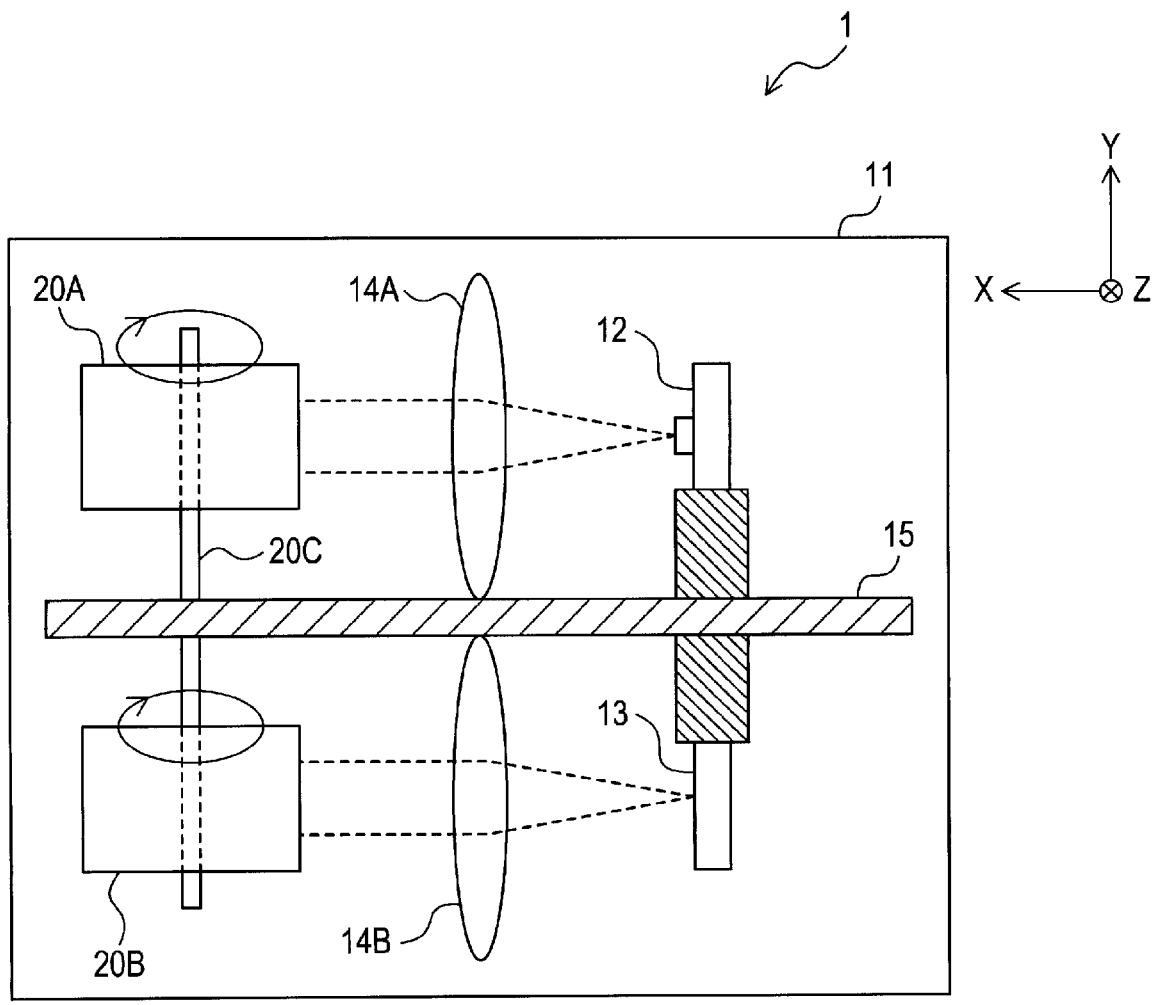
FIG. 1 is a rear view of an overall configuration of an optical scanning apparatus.

JP-A-2010-145486 discloses a configuration in which, in an optical scanning apparatus that is configured to scan light waves inside a printer, a reflectance in a region of a reflection mirror that is not used for scanning of the light waves is set to be low to suppress unnecessary light from being reflected by the reflection mirror.

Here, in an optical scanning apparatus such as a radar apparatus that is used in a vehicle, a light-emitting unit that emits light waves and a light-receiving unit that receives a reflected wave of the light waves are provided. The optical scanning apparatus in this case is configured to scan the light waves outside the apparatus by emitting the light waves from a transmissive member that transmits the light waves, rather than scanning the light waves inside the apparatus as in the above-described printer.

As a result of detailed examination by the inventors, an issue has been found in that, in such a configuration, the scanned light wave may be reflected by the transmissive member, and reflected light thereof may be further reflected by the reflection mirror and become stray light. The stray light being incident on the light-receiving unit may cause an erroneous detection when the optical scanning apparatus functions as a sensor. Here, the technology in above-described JP-A-2010-145486 does not take into consideration suppression of stray light attributed to the transmissive member.

An aspect of the present disclosure is to enable, in an optical scanning apparatus that is configured to scan light waves, suppression of light waves that is reflected by a transmissive member from becoming stray light and being incident on a light-receiving unit.

An exemplary embodiment of the present disclosure provides an optical scanning apparatus that is configured to scan light waves. The optical scanning apparatus includes a light-emitting unit, a light-receiving unit, a transmissive member, and at least one reflection mirror. The light-emitting unit emits light waves. The light-receiving unit receives reflected light of the light waves. The transmissive member is configured to transmit the light waves and the reflected light of the light waves.

The at least one reflection mirror is arranged further toward the light-emitting unit side and light-receiving unit side than the transmissive member is. The at least one reflection mirror includes at least one reflection surface that rotates. The at least one reflection mirror is configured to deflect at least either of the light waves and the reflected light using the reflection surface. The at least one reflection mirror includes a low reflection region on the transmissive member side of the reflection surface. The low reflection region has a reflectance of the light waves on the reflection surface that is set to be lower than a reflectance of the light waves on the other region other than the low reflection region of the reflection surface, in a state in which the reflection surface is facing the light-emitting unit side or the light-receiving unit side.

Here, it is known that, in an optical scanning apparatus that includes a transmissive member and scans light waves using a reflection mirror that rotates, when light waves that is reflected by the transmissive member is further reflected by the reflection mirror and becomes stray light, the light waves are reflected on the transmissive member side of the reflection surface of the reflection mirror. Therefore, in the configuration of the present disclosure, the low reflection region is provided on the transmissive member side of the reflection surface, and an amount of light of the stray light is suppressed.

According to this configuration, the amount of light of the stray light can be suppressed in the low reflection region. Thus, the light waves that are reflected by the transmissive member can be suppressed from becoming stray light and being incident on the light-receiving unit. Here, the transmissive member side of the reflection surface is a portion on the transmissive member side when the reflection surface is facing the light-emitting unit or the light-receiving unit.

Embodiments of an aspect of the present disclosure will hereinafter be described with reference to the drawings.

1. First Embodiment

[1-1. Configuration]

For example, an optical scanning apparatus 1 shown in FIG. 1 is mounted in a vehicle such as a passenger car and is configured to scan light waves. The optical scanning apparatus 1 emits the scanned light wave outside the optical scanning apparatus 1 and receives a reflected wave that is reflected by an object of some kind. For example, the optical scanning apparatus 1 configures a portion of an object detection apparatus that detects a position of an object based on a direction in which the light waves are emitted and an amount of time from when the light waves are emitted until the reflected wave is received.

As shown in FIG. 1, the optical scanning apparatus 1 includes a light-emitting unit 12, a light-receiving unit 13, a transmissive member 11, and a plurality of reflection mirrors 20A and 20B. The optical scanning apparatus 1 has a two-layer structure in which an internal space is partitioned into upper and lower portions by a partitioning plate 15 that partitions the optical scanning apparatus 1 into upper and lower portions. In addition, the optical scanning apparatus 1 includes a configuration for scanning the light waves in the upper portion of the partitioning plate 15 and a configuration for receiving reflected light of the light waves in a lower portion of the partitioning plate 15.

The light-emitting unit 12 is arranged in the upper portion of the partitioning plate 15 and is configured to emit the light waves in a positive direction on an X-axis. In FIG. 1, the positive direction on the X-axis is a leftward direction on a paper surface. For example, the light-emitting unit 12 is configured as an apparatus that generates light waves, such as a laser diode. The light waves that are emitted from the light-emitting unit 12 is configured to move toward the reflection mirror 20A while diffusion of the light waves is suppressed by an irradiation lens 14A that is arranged in the upper portion of the partitioning plate 15.

The reflection mirror 20A on the light-emitting side of the plurality of reflection mirrors 20A and 20B is arranged in the upper portion of the partitioning plate 15. The reflection mirror 20A includes a reflection surface that has two front and rear surfaces and rotates. The reflection mirror 20A is configured to deflect the light waves that pass through the irradiation lens 14A in a positive direction on a Z-axis using the reflection surface. In FIG. 1, the positive direction on the Z-axis is toward a rear side on the paper surface.

The transmissive member 11 is arranged further toward the positive direction side on the Z-axis than the light-emitting unit 12 is, the light-receiving unit 13, the reflection mirrors 20A and 20B, and the like. For example, the transmissive member 11 is composed of a material that transmits the light waves that are emitted from the light-emitting unit 12, such as acrylic or glass, and functions as a cover portion for protecting constituent elements of the optical scanning apparatus 1. The transmissive member 11 transmits the light waves that are deflected by the reflection mirror 20A and transmits the reflected light that is generated by the emitted light wave being reflected by an object.

The reflection mirror 20B on the light-receiving side of the plurality of reflection mirrors 20A and 20B is arranged in the lower portion of the partition plate 15. In a manner similar to the reflection mirror 20A, the reflection mirror 20B includes a reflection surface that has two front and rear surfaces and rotates. The reflection mirror 20B is configured to rotate while being synchronized such that an orientation of the reflection surface provided in the reflection mirror 20B coincides with an orientation of the reflection surface provided in the reflection mirror 20A. The reflection mirror 20B deflects a reflected light toward a light-receiving lens 14B, the reflected light being the light waves emitted by scanning that is reflected by an object of some kind, transmitted through the transmissive member 11, and returns from the positive direction on the Z-axis.

The light-receiving lens 14B is arranged in the lower portion of the partitioning plate 15, and converges the reflected light that is incident from the reflection mirror 20B such that the reflected light can be received by the light-receiving unit 13.

The light-receiving unit 13 is arranged in the lower portion of the partitioning wall 15 directly under the light-emitting unit 12. The light-receiving unit 13 is configured to receive the reflected light that passes through the light receiving lens 14B and arrives from the positive direction on the X-axis. For example, the light-receiving unit 13 is configured by a photo diode and outputs a voltage based on an intensity of the reflected light to a calculating unit of the object detection apparatus or the like.

Figure 2:
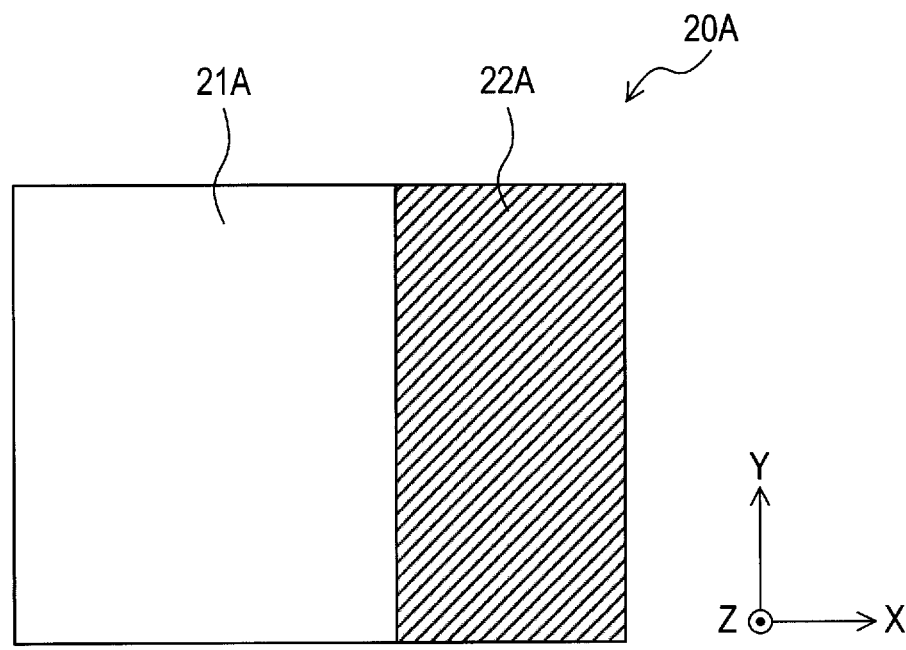
FIG. 2 is a front view of a reflection mirror on a light-emitting side.

Here, as shown in FIG. 2, the reflection mirror 20A on the light-emitting side has a plurality of regions that have differing reflectances within a same reflection surface. As the plurality of regions, a high reflection region 21A and a low reflection region 22A are provided. Here, the reflection mirrors 20A and 20B have similar configurations on both front and rear of the reflection surfaces.

Figure 3:
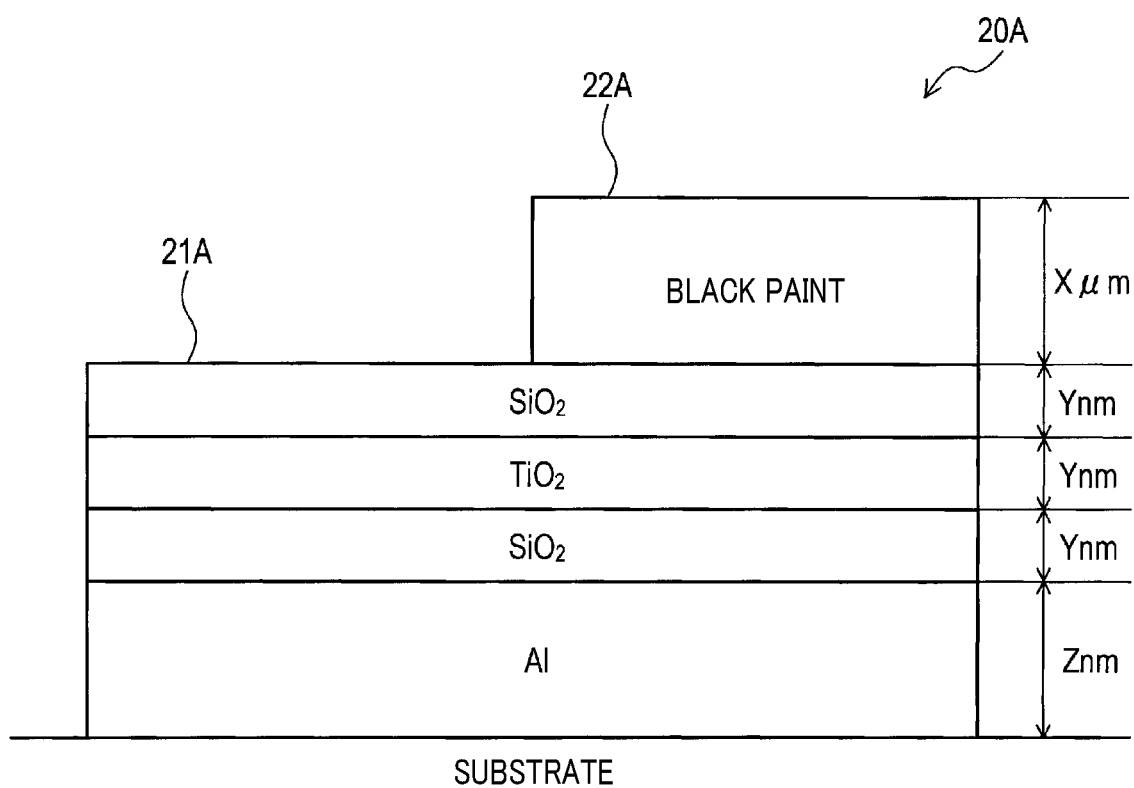
FIG. 3 is a cross-section of the reflection mirror on the light-emitting side according to a first embodiment.

The high reflection region 21A is configured as a mirror surface that reflects most of the light waves of a wavelength emitted from the light-emitting unit 12. The high reflection region 21A is configured by a metal film and a dielectric film being laminated on a substrate of the reflection mirror 20A. Specifically, as shown in FIG. 3, for example, the high reflection region 21A is configured by an aluminum film, a silicon dioxide film, a titanium dioxide film, and a silicon dioxide film being laminated in order. Here, thicknesses of the metal film and the dielectric film configuring the high reflection region 21A can be arbitrarily set. In addition, the high reflection region 21A is not required to include the metal film. The high reflection region 21A may be configured by only the dielectric film. In this case, the titanium dioxide film and the silicon dioxide film are typically laminated in order.

The low reflection region 22A is a section in which a reflectance of the light waves on the reflection surface is set to be lower than that in the high reflection region 21A. For example, as shown in FIG. 3, the low reflection region 22A is configured by black paint being applied to the high reflection region 21A. In the low reflection region 22A, light is absorbed by the black paint and the reflectance thereby decreases.

The low reflection region 22A is arranged on the transmissive member 11 side in a state in which the reflection surface faces the light emitting-unit 12 side or the light-receiving unit 13 side, that is, in a state in which the light waves can be reflected toward the transmissive member 11 side. In other words, when the reflection surface is viewed from the positive direction on the Z-axis, the low reflection region 22A is arranged on the positive-direction side on the Z-axis of the reflection surface. In the example shown in FIG. 2, of the reflection surface, about 25 to 30% from an end portion on the positive-direction side on the X-axis is set to the low reflection region 22A.

Figure 4:
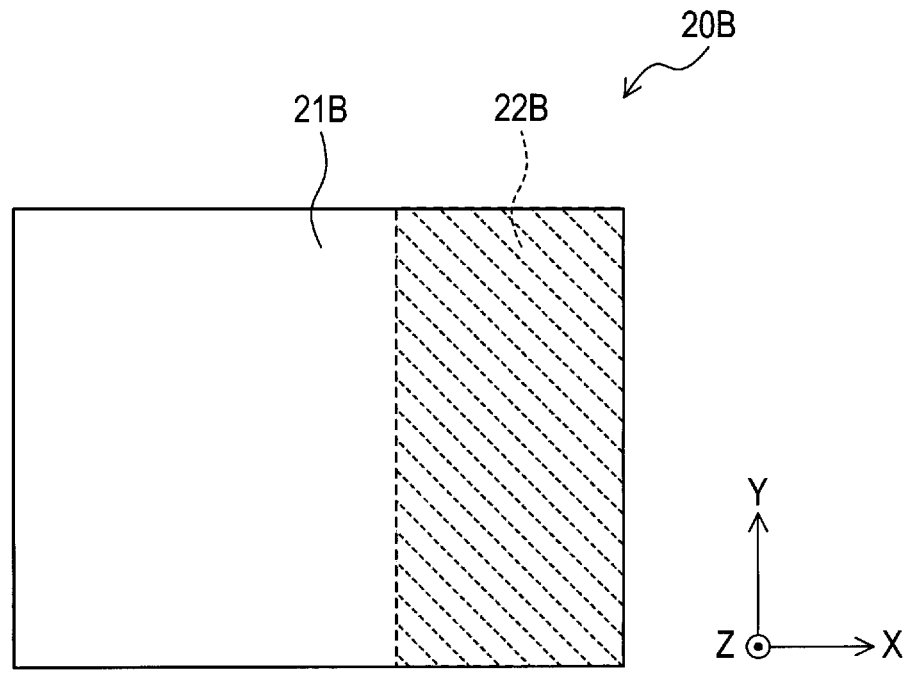
FIG. 4 is a front view of a reflection mirror on a light-receiving side.

Meanwhile, the reflection mirror 20B on the light-receiving side includes only the high reflection region 21B in which the overall reflection surface has uniform reflectance. Here, FIG. 4 shows the high reflection region 21B and a low reflection region 22B that is indicated by broken lines. However, here, the low reflection region 22B is not present and the overall reflection surface is considered to be the high reflection region 21B. The high reflection region 21B is configured in a manner similar to the high reflection region 21A of the reflection mirror 20A on the light-emitting side.

Figure 5:
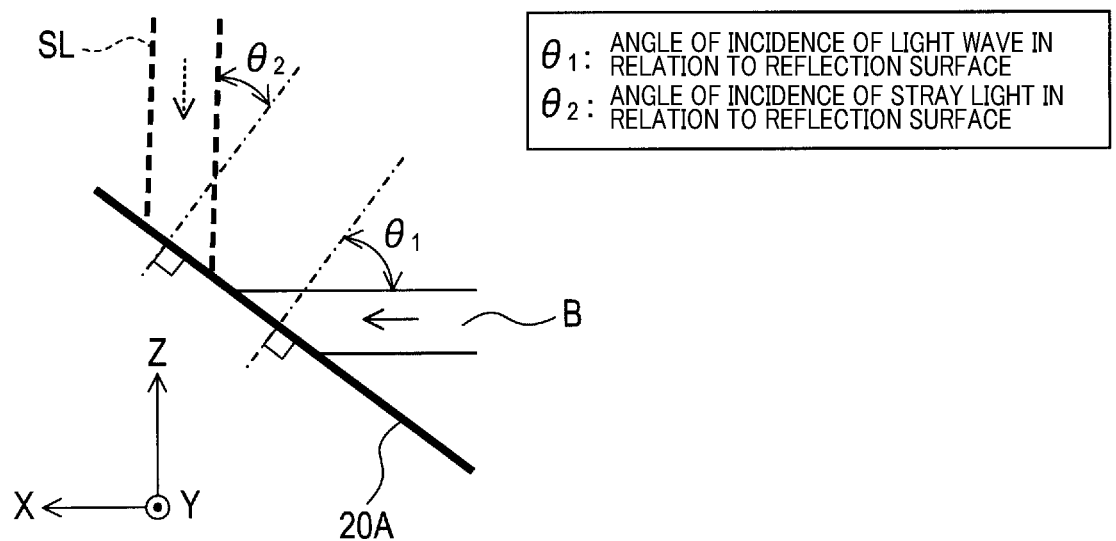
FIG. 5 is an explanatory diagram illustrating an angle of incidence relative to the reflection mirror.

Here, as shown in FIG. 5, an angle of incidence of the light waves relative to the reflection surface is $\theta_1$, and an angle of incidence of stray light on the reflection surface is $\theta_2$. Here, the stray light refers to light waves that are reflected by the transmissive member 11 and emitted in a direction that differs from a direction in which the light waves are originally intended to be emitted. In FIG. 5 and subsequent drawings, light waves that are not stray light is denoted by B and the stray light is denoted by SL.

Figure 6:
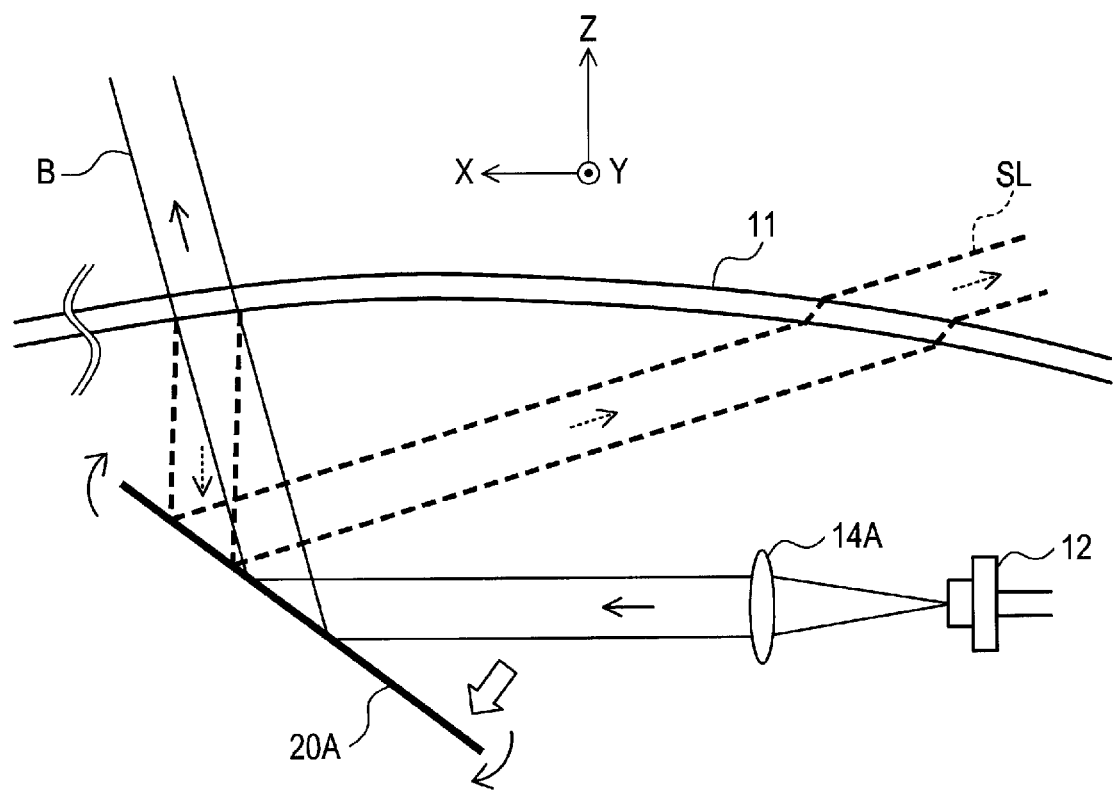
FIG. 6 is a plan view of an example of occurrence of first stray light.

In the configuration in which the transmissive member 11 is provided and the light waves are scanned using the reflection mirror 20A that rotates, as in the optical scanning apparatus 1 according to the present embodiment, as shown in FIG. 6, the light waves that are reflected by the reflection mirror 20A may be further reflected by the transmissive member 11. The light waves may again be reflected by the reflection mirror 20A and become stray light.

It is known that, when, as according to the present embodiment, the light waves that are emitted from the light-emitting unit 12 is incident on the reflection mirror 20A so as to be substantially parallel to the transmissive member 11 and scanned toward the transmissive member 11 side, the stray light easily occurs when the angle of incidence $\theta_1$ of the light waves is around 55 deg. A condition under which the stray light occurs differs depending on a setup angle of the transmissive member 11 relative to the reflection mirror 20A, a direction in which the light-emitting unit 12 emits the light waves to the reflection mirror 20A, and the like. However, the stray light tends to be reflected on the reflection surface of the reflection mirror 10A further toward the transmissive member 11 side.

Figure 7:
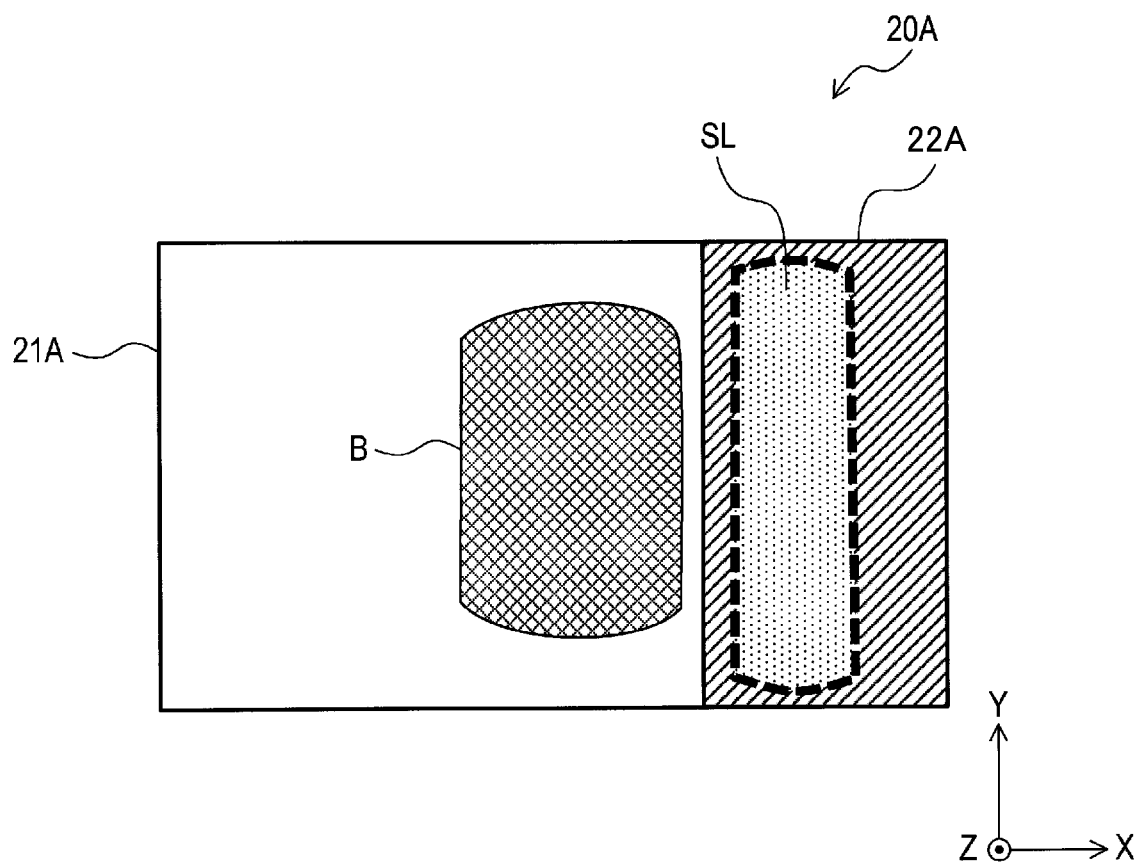
FIG. 7 is a front view of a reflection position of a scanned light wave and a reflection position of stray light in the example of occurrence of first stray light.

Here, an example in FIG. 6 shows a case in which the angle of incidence $\theta_1$ of the light waves is 52 deg and the angle of incidence $\theta_2$ of the stray light is 37 deg. As a result of examination by the inventors, as shown in FIG. 6, it is clear that the stray light is reflected in a region on the transmissive member 11 side of the reflection mirror 20A on the light-emitting side. Under the condition shown in FIG. 6, as shown in FIG. 7, the light waves that are emitted from the light-emitting unit 12 is reflected near a center of the reflection surface. However, the stray light is reflected further toward the transmissive member 11 side than the light waves that are emitted from the light-emitting unit 12 is.

However, according to the present embodiment, the low reflection region 22A is provided on the transmissive member 11 side of the reflection surface and the stray light is reflected in the low reflection region 22A. Therefore, an amount of light of the stray light is suppressed. That is, according to the present embodiment, as a result of the amount of light of the stray light being suppressed, reflected light due to the stray light is not easily incident on the light-receiving unit 13.

Figure 8:
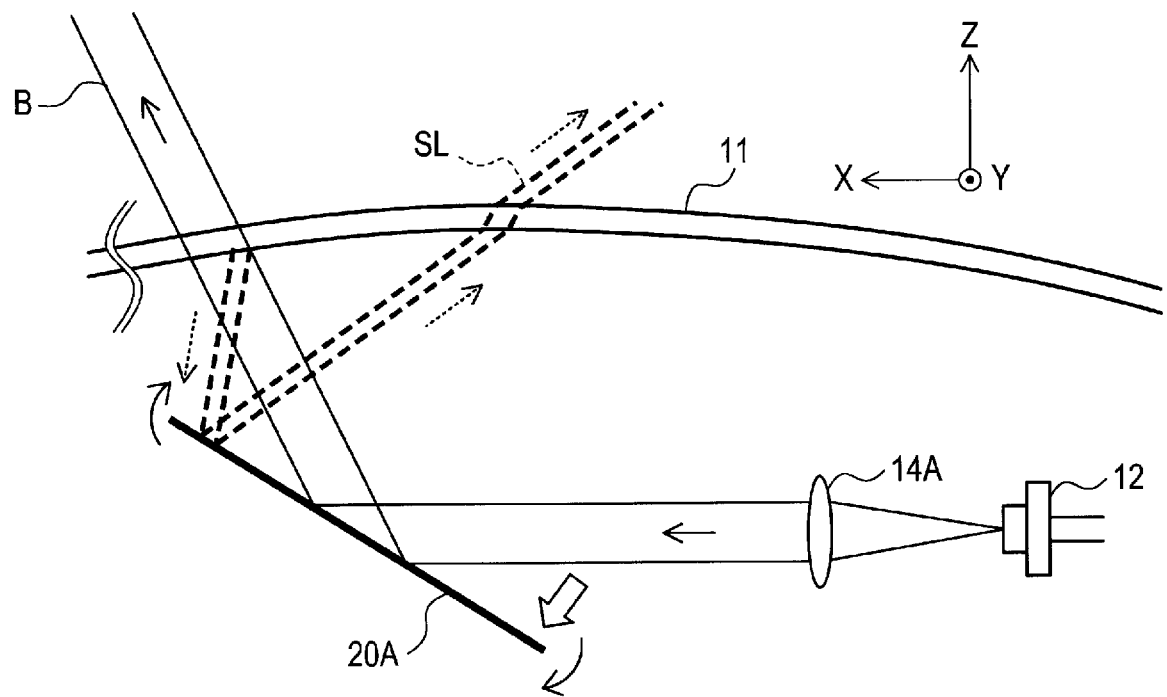
FIG. 8 is a plan view of an example of occurrence of second stray light.

Here, an example in FIG. 8 shows a case in which the angle of incidence $\theta_1$ of the light waves is 58 deg and the angle of incidence $\theta_2$ of the stray light is 22 deg. Even if the angle of incidence $\theta_1$ of the light waves more greatly changes, the stray light is reflected further toward the transmissive member 11 side than the region in which the light waves that are emitted from the light-emitting unit 12 is reflected on the reflection surface.

Figure 9:
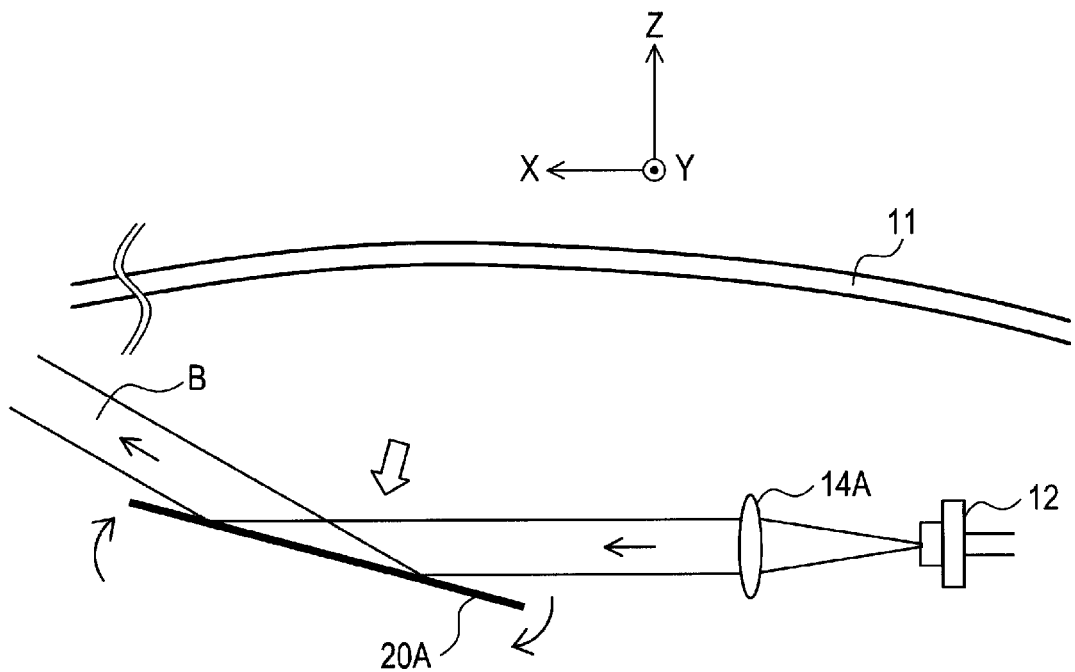
FIG. 9 is a plan view of an example of a state in which stray light does not occur.
Figure 10:
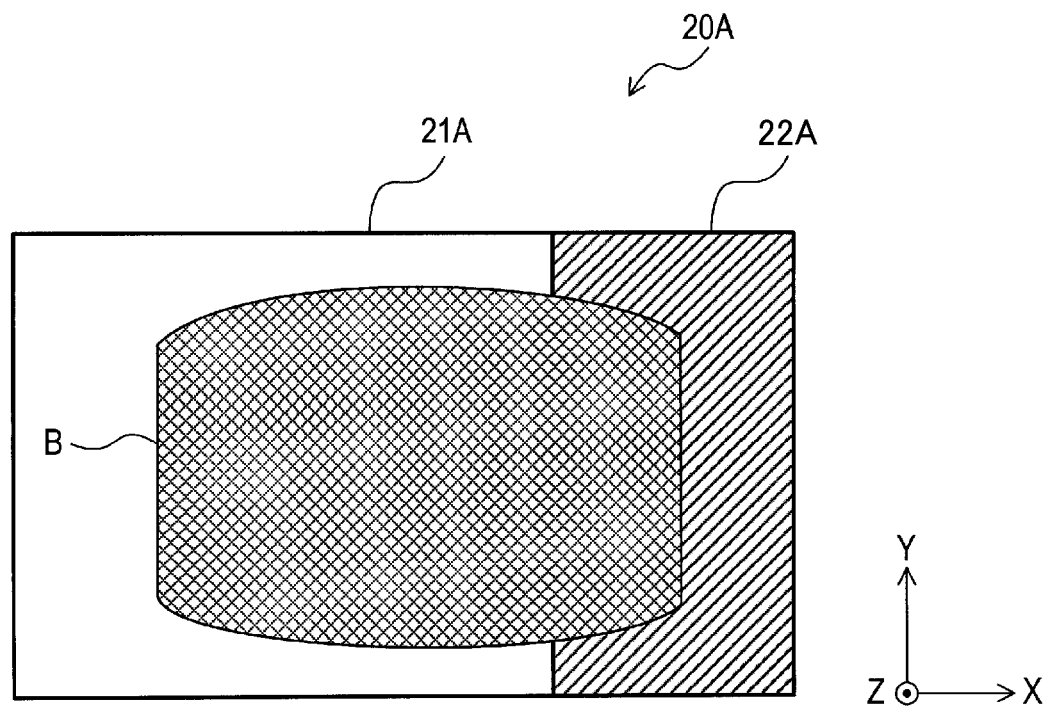
FIG. 10 is a front view of a reflection position of a scanned light wave and a reflection position of stray light in the example of a state in which stray light does not occur.

Here, as shown in FIG. 9, when the angle of incidence $\theta_1$ of the light waves further increases, the stray light disappears. At this time, as shown in FIG. 10, the light waves that are emitted from the light-emitting unit 12 is reflected not only in the high reflection region 21A of the reflection surface but also spreads to the low reflection region 22A and is reflected. However, because a ratio of areas of the high reflection region 21A and the low reflection region 22A is set such that most of the light waves is reflected by the high reflection region 21A, an amount of light of the light waves is favorably ensured.

[1-2. Experiment Example According to a First Embodiment]

Next, an experiment to measure the reflectances of the high reflection region 21A and the low reflection region 22A of the reflection mirror 20A on the light-emitting side was performed. In the experiment, three types of light waves of which the wavelengths are 830 nm, 870 nm, and 910 nm were separately irradiated onto the high reflection region 21A and the low reflection region 22A while changing the angle of incidence, and the reflectances were measured.

In addition, in the experiment, the reflectance was measured for each of an S-polarized light and a P-polarized light. Here, with a plane that is perpendicular to the reflection surface of the reflection mirror 20A and includes incident light and reflected light as an a plane of incidence, the S-polarized light indicates a polarized light of which an electric field oscillates perpendicular to the plane of incidence and the P-polarized light indicates a polarized light of which an electric field oscillates within the plane of incidence.

Figure 11:
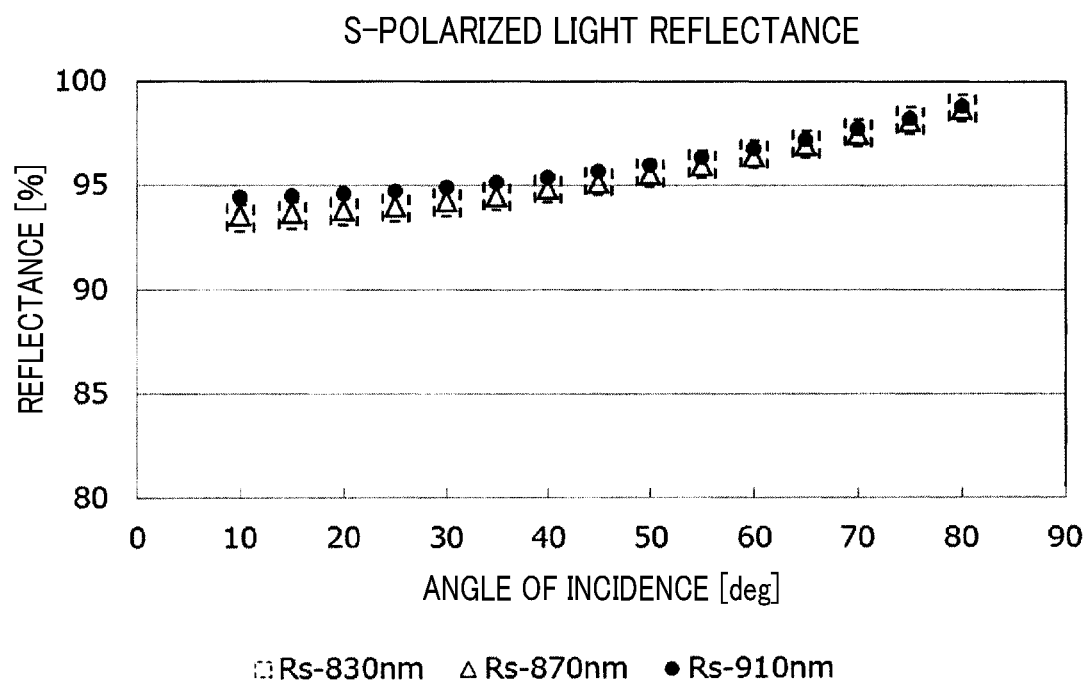
FIG. 11 is a graph illustrating a relationship between the angle of incidence relative to a high reflection region and a reflectance of S-polarized light.
Figure 12:
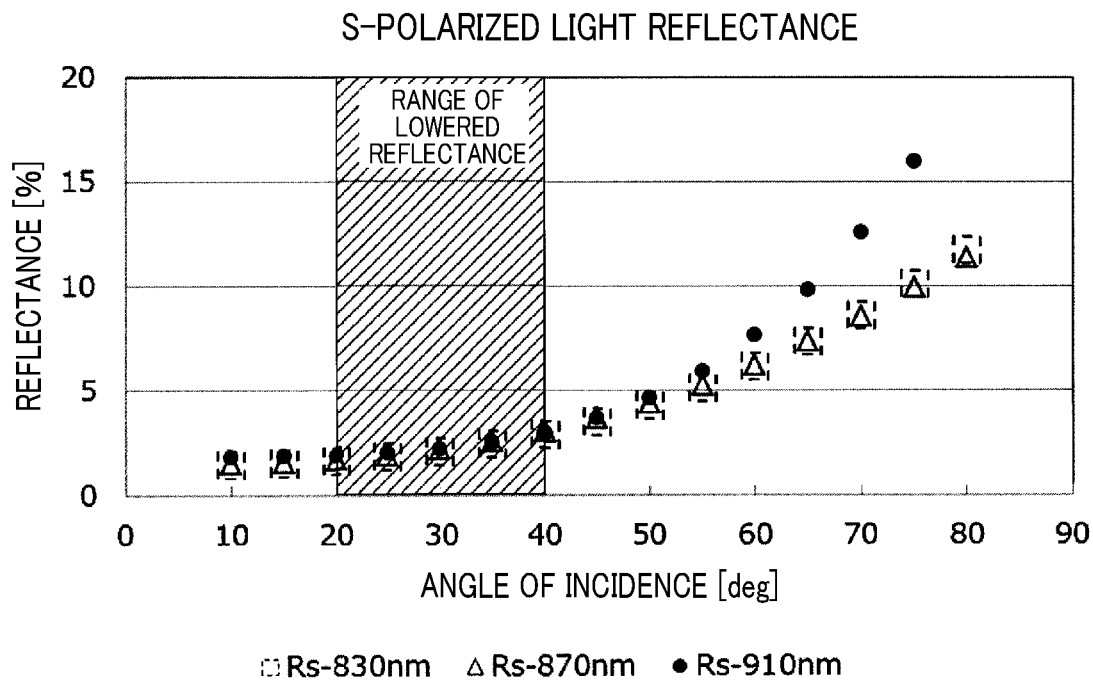
FIG. 12 is a graph illustrating a relationship between the angle of incidence relative to a low reflection region and the reflectance of S-polarized light according to the first embodiment.

As shown in FIG. 11, as the reflectance of the S-polarized light in the high reflection region 21A, 92% or greater is ensured regardless of the wavelength and the angle of incidence of the light waves. As shown in FIG. 12, the reflectance of the S-polarized light in the low reflection region 22A is suppressed to less than 10% regardless of the wavelength of the light waves, if the angle of incidence is less than 60 deg, that is, if the condition is such that stray light occurs. That is, the amount of light of the stray light can be suppressed to less than 10%.

Here, in the reflection mirror 20A, the low reflection region 22A is configured such that the reflectance increases as the angle of incidence of the incident light increases. When the angle of incidence is equal to or greater than 75 deg, a reflectance that is equal to or greater than 10% is ensured regardless of the wavelength of the light waves.

Figure 13:
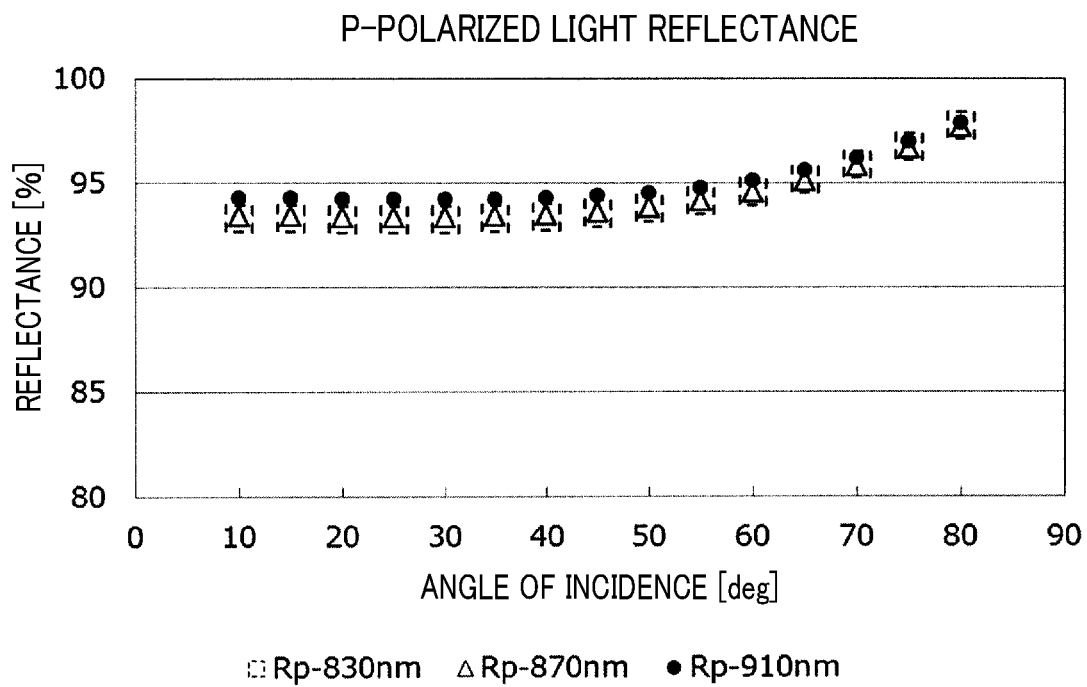
FIG. 13 is a graph illustrating a relationship between the angle of incidence relative to the high reflection region and a reflectance of P-polarized light.
Figure 14:
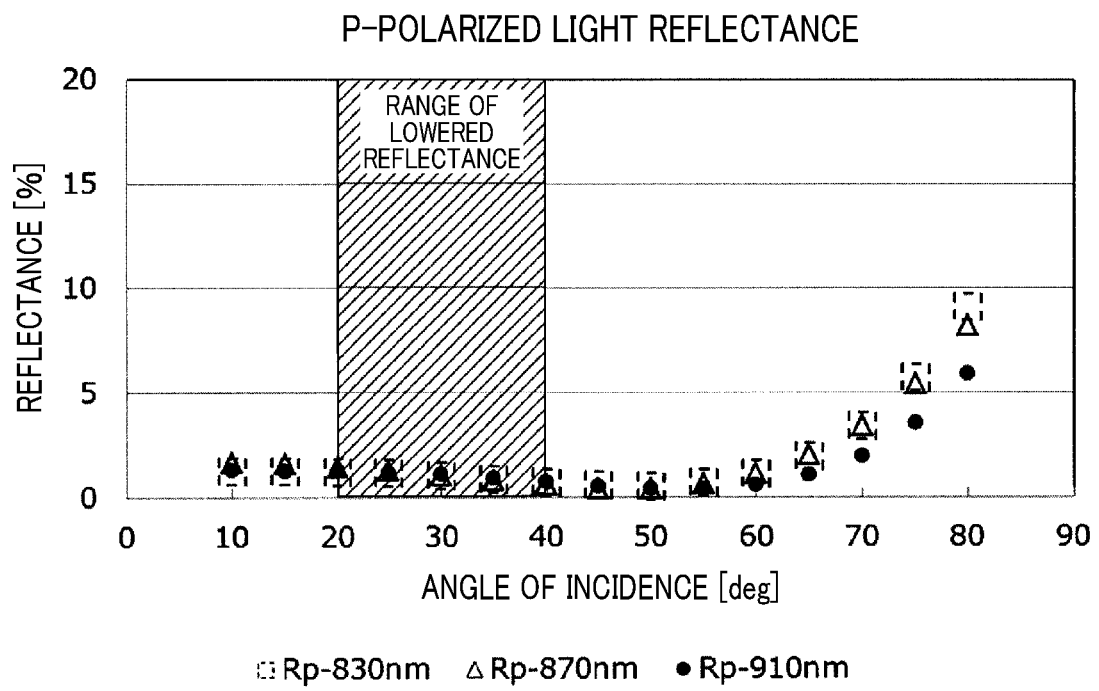
FIG. 14 is a graph illustrating a relationship between the angle of incidence relative to the low reflection region and the reflectance of P-polarized light according to the first embodiment.

As shown in FIG. 13, as the reflectance of the P-polarized light in the high reflection region 21A, 92% or greater is ensured regardless of the wavelength and the angle of incidence of the light waves. This tendency is substantially similar to that in the case of the S-polarized light. In addition, as shown in FIG. 14, the reflectance of the P-polarized light in the low reflection region 22A is suppressed to less than 3% regardless of the wavelength of the light waves, if the angle of incidence is less than 60 deg.

Furthermore, the reflectance of the P-polarized light in the low reflectance region 22A is suppressed to substantially less than 10% regardless of the wavelength of the light waves, even if the angle of incidence is equal to or greater than 75 deg. However, even in the case of the P-polarized light, the reflectance in the low reflection region 22A has a tendency to increase as the angle of incidence of the incident light increases.

[1-3. Effects]

According to the first embodiment described in detail above, following effects are achieved.

(1a) An aspect of the present disclosure is configured as the optical scanning apparatus 1 that scans light waves. The optical scanning apparatus 1 includes the light-emitting unit 12, the light-receiving unit 13, the transmissive member 11, and at least one reflection mirror 20A or 20B. The light-emitting unit 12 is configured to emit the light waves. The light-receiving unit 13 is configured to receive reflected light of the light waves. The transmissive member 11 is configured to transmit the light waves and the reflected light of the light waves.

The reflection mirror 20A is arranged further toward the light-emitting unit 12 side and light-receiving unit 13 side than the transmissive member 11 is. The reflection mirror 20A includes at least one reflection surface that rotates. The reflection mirror 20A is configured to deflect at least either of the light waves and the reflected light using the reflection surface. In addition, the reflection mirror 20A includes the low reflection region 22A on the transmissive member 11 side of the reflection surface. The low reflection region 22A has the reflectance of the light waves on the reflection surface that is set to be lower than the reflectance of the light waves on the other region other than the low reflection region 22A of the reflection surface, in a state in which the reflection surface is facing the light-emitting unit 12 side or the light-receiving unit 13 side.

In this configuration, the amount of light of the stray light can be suppressed in the low reflection region 22A. Thus, the light waves that are reflected by the transmissive member 11 can be suppressed from becoming stray light and being incident on the light-receiving unit 13. Here, the transmissive member 11 side of the reflection surface is a portion on the transmissive member 11 side when the reflection surface is facing the light-emitting unit 12 or the light-receiving unit 13.

(1b) In the reflection mirror 20A, the low reflection region 22A is configured such that the reflectance increases as the angle of incidence of the incident light increases. Here, in the optical scanning apparatus 1, it is known that the stray light easily occurs when the angle of incidence of the light waves that are incident on the low reflection region 22A is within a predetermined range, and the stray light does not easily occur when the angle of incidence of the light waves that are incident on the low reflection region 22A is greater than the predetermined range.

In addition, when the angle of incidence of the light waves increases, a region that is required for reflection of the light waves on the reflection surface widens, and the light waves are reflected using not only the high reflection region 21A but also the low reflection region 22A. Therefore, in the low reflection region 22A, when the angle of incidence is small, the reflectance is reduced to suppress stray light. When the angle of incidence is large, the reflectance is set to be large such that the light waves or the reflected light can be favorably reflected.

According to this configuration, the reflection mirror 20A can provide a function for suppressing stray light and a function for favorably reflecting the light waves or the reflected light.

2. Second Embodiment

[2-1. Differences with the First Embodiment]

A basic configuration according to a second embodiment is similar to that according to the first embodiment. Therefore, differences will be described below. Here, reference numbers that are same as those according to the first embodiment indicate identical configurations. Preceding descriptions are referenced.

According to the above-described first embodiment, the low reflection region 22A of the reflection mirror 20A is formed by the high reflection region 21A being coated with black paint. In contrast, the second embodiment differs from the first embodiment in that the low reflection region 22C is formed by a metal film and a dielectric film being laminated on the high reflection region 21A.

[2-2. Configuration]

Figure 15:
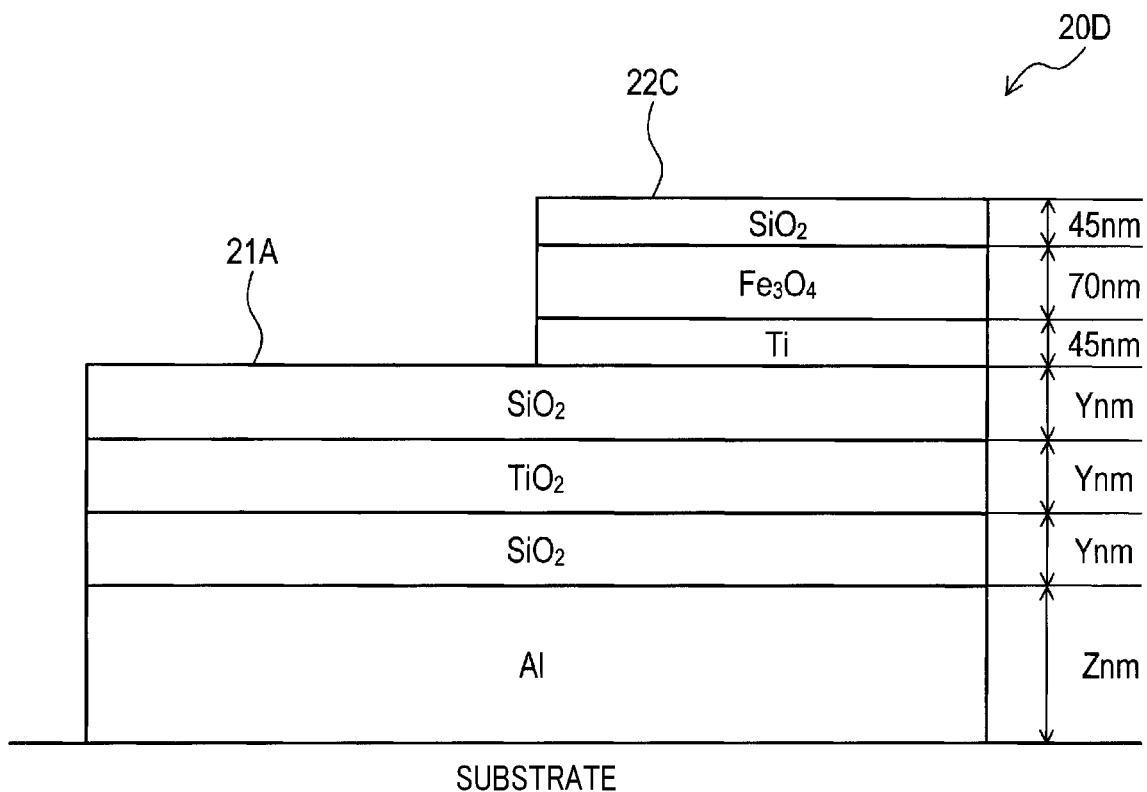
FIG. 15 is a cross-section of a reflection mirror on a light-emitting side according to a second embodiment.

In an optical scanning apparatus according to the second embodiment, a reflection mirror 20D is provided instead of the reflection mirror 20A according to the first embodiment. As shown in FIG. 15, the reflection mirror 20D includes a low reflection region 22C and the above-described high reflection region 21A on the reflection surface.

The low reflection region 22C is configured as a multilayer film in which a 45-nm titanium film, a 70-nm iron oxide film, and a 45-nm silicon dioxide film are laminated in order in the high reflection region 21A.

[2-3. Experiment Example According to the Second Embodiment]

Next, an experiment to measure the reflectance in the low reflection region 22A of the reflection mirror 20D on the light-emitting side was performed. Here, the high reflection region 21A of the reflection mirror 20D on the light-emitting side is similar to the high reflection region 21A according to the first embodiment. Therefore, a description thereof is omitted. In the present experiment, in a manner similar to that in the experiment example according to the first embodiment, three types of light waves of which the wavelengths are 830 nm, 870 nm, and 910 nm were irradiated onto the low reflection region 22C while changing the angle of incidence for each of the S-polarized light and the P-polarized light, and the reflectance was measured.

Figure 16:
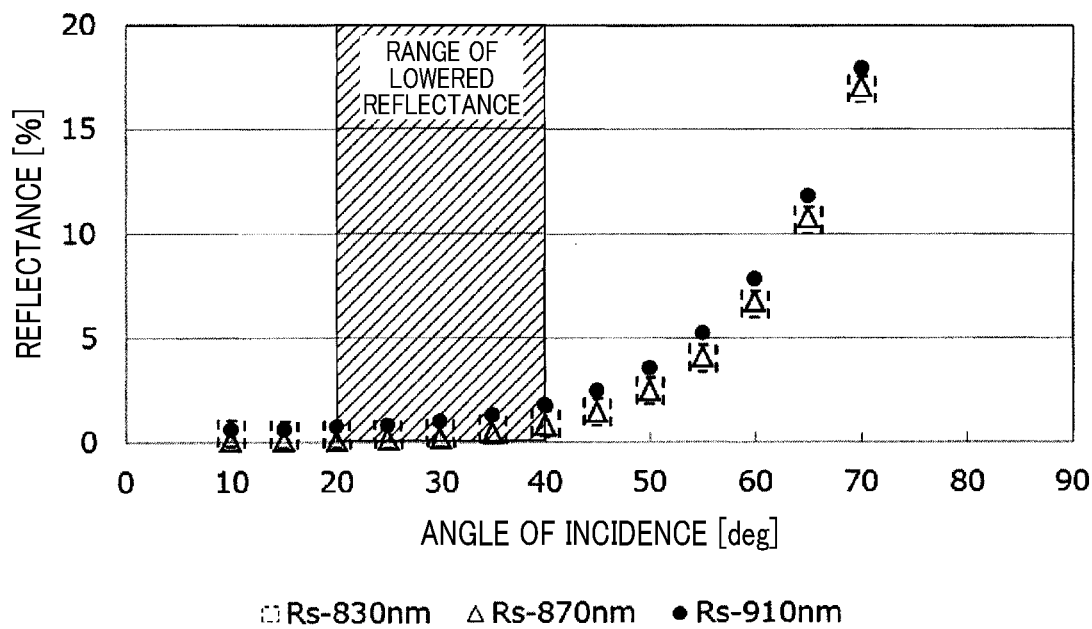
FIG. 16 is a graph illustrating a relationship between the angle of incidence relative to a low reflection region and the reflectance of S-polarized light according to the second embodiment.
Figure 17:
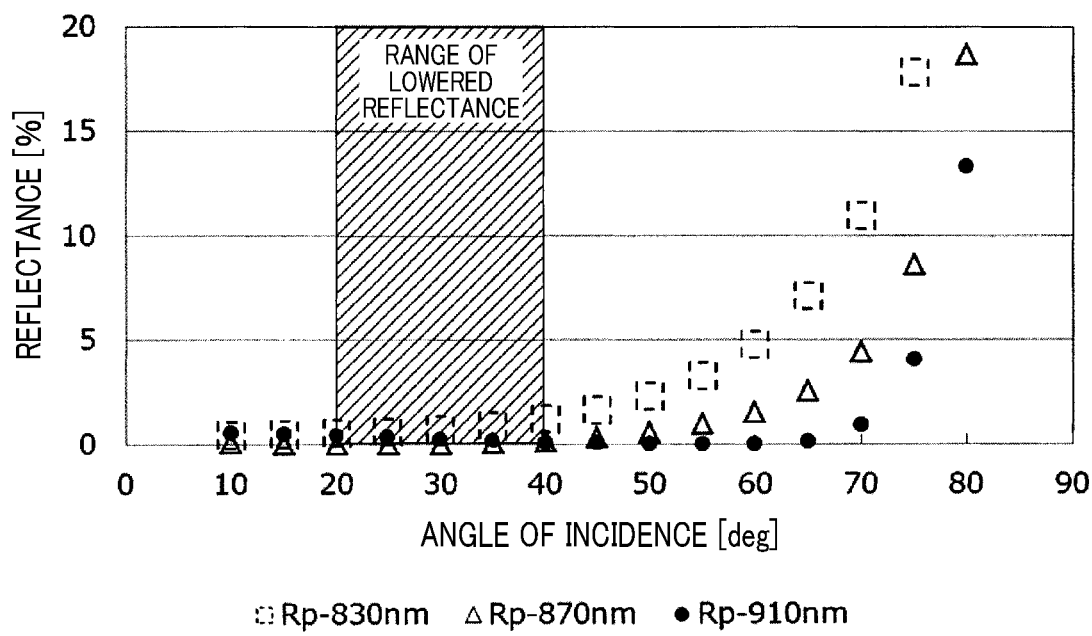
FIG. 17 is a graph illustrating a relationship between the angle of incidence relative to the low reflection region and the reflectance of P-polarized light according to the second embodiment.

As shown in FIG. 16, the reflectance of the S-polarized light in the low reflection region 22C is suppressed to less than 10% regardless of the wavelength of the light waves, if the angle of incidence is less than 60 deg. In addition, as shown in FIG. 17, the reflectance of the P-polarized light in the low reflection region 22A is suppressed to less than 5% regardless of the wavelength of the light waves, if the angle of incidence is less than 60 deg.

Here, the low reflection region 22C according to the second embodiment is configured such that the reflectance more rapidly increases as the angle of incidence of the incident light increases, compared to the low reflection region 22A according to the first embodiment. For example, regarding the S-polarized light, the reflectances in the low reflection region 22A according to the first embodiment and the low reflection region 22C according to the second embodiment are substantially equal at 60 deg. In contrast, at 70 deg, whereas the reflectance in the low reflection region 22A according to the first embodiment is about 10%, the reflectance in the low reflection region 22C according to the second embodiment is greater at about 17%. Here, a similar tendency is obtained regarding the P-polarized light as well.

[2-4. Effects]

According to the second embodiment described in detail above, the effect (1a) according to the first embodiment, described above, is achieved. In addition, following effects are achieved.

(2a) The light-emitting unit 12 is configured to emit the light waves. In addition, at least the low reflection region 22C of the reflection mirror 20D further includes the dielectric film that reflects the light waves. The dielectric film typically has a characteristic in that the reflectance increases as the angle of incidence increases.

According to this configuration, the reflectance increases as the angle of incidence of the incident light increases. Such a configuration can be obtained using the dielectric film.

(2b) The low reflection region 22C further includes a multilayer film in which a titanium film, an iron oxide film, and a silicon dioxide film are laminated in order.

As a result of a configuration such as this, a configuration in which the reflectance rapidly increases as the angle of incidence of the incident light increases, and a sufficient reflectance can be ensured can be actualized using the multilayer film composed of a metal and a dielectric substance.

3. Other Embodiments

The embodiments of the present disclosure are described above. However, the present disclosure is not limited to the above-described embodiments. Various modifications are possible.

(3a) According to the above-described embodiments, the reflection mirrors 20A and 20D on the light-emitting side include the high reflection region 21A and the low reflection regions 22A and 22C. The reflection mirror 20B on the light-receiving side does not include the low reflection region. However, this is not limited thereto. For example, the reflection mirror 20B on the light-receiving side may include the low reflection region 22B as shown by broken lines in FIG. 4, in a manner similar to the reflection mirrors 20A and 20D on the light-emitting side.

According to this configuration, the low reflection regions 22A, 22B, and 22C are respectively set in the reflection mirrors 20A, 20D, and 20B. Thus, the amount of light of the stray light that is emitted from the optical scanning apparatus 1 can be suppressed and reception light sensitivity to the reflected light attributed to the stray light can be reduced by the reflection mirror 20B on the light-receiving side. Consequently, the influence of stray light on the light-receiving unit 13 can be reduced even more difficult to detect in the light-receiving unit 13.

(3b) In the above-described configuration in (3a), the reflectance in the low reflection region 22B of the reflection mirror 20B on the light-receiving side may be set to be higher than the reflectance in the low reflection regions 22A and 22C of the reflection mirrors 20A and 20D on the light-emitting side. For example, the reflectance in the low reflection region 22B may be set to about 50%.

According to this configuration, the reflectance in the low reflection region 22B of the reflection mirror 20B is set to be higher than the reflectance in the low reflection regions 22A and 22C in the reflection mirrors 20A and 20D. Therefore, in a state in which the angle of incidence is large and the reflected light spreads over the reflection surface, an amount of light of the reflected light being excessively reduced can be prevented by the low reflection region 22B of the reflection mirror 20B. Therefore, the reflected light can be more easily detected in the light-receiving unit 13.

(3c) According to the above-described embodiments, the reflection mirror 20A or 20D on the light-emitting side and the reflection mirror 20B on the light-receiving side are separate, and a rotation shaft is shared. However, this configuration is not limited thereto. For example, the reflection mirror 20A or 20D on the light-emitting side and the reflection mirror 20B on the light-receiving side may be integrated. In this case, the light-emitting unit 12 and the light-receiving unit 13 may emit or receive the light waves or the reflected light using a shared reflection surface. In addition, when the reflection mirror 20A or 20D on the light-emitting side and the reflection mirror 20B on the light-receiving side are separate, the rotation shaft may not necessarily be configured to be shared.

(3d) According to the above-described embodiments, an example in which the optical scanning apparatus 1 is applied to a distance measurement apparatus of an object detection apparatus or the like is described. However, this is not limited thereto. For example, the optical scanning apparatus 1 can be applied to a head-up display, a projector, or the like. The light-receiving unit 13 in this case can be used in a configuration for detecting ambient brightness, a configuration for detecting a amount of light of an emitted light wave, or the like.

(3e) A plurality of functions provided by a single constituent element according to the above-described embodiments may be actualized by a plurality of constituent elements. A single function provided by a single constituent element may be actualized by a plurality of constituent elements. In addition, a plurality of functions provided by a plurality of constituent elements may be actualized by a single constituent element. A single function provided by a plurality of constituent elements may be actualized by a single constituent element. Furthermore, a part of a configuration according to the above-described embodiments may be omitted. Moreover, at least a part of a configuration according to an above-described embodiment may be added to or replace a configuration according to another of the above-described embodiments.

(3f) The present disclosure can also be actualized by various modes in addition to the above-described optical scanning apparatus 1, such as a system of which the optical scanning apparatus 1 is a constituent element.

What is claimed is:

1. An optical scanning apparatus that scans light waves, comprising:
    a light-emitting unit that is configured to emit light waves;
    a light-receiving unit that is configured to receive reflected light of the light waves;
    a transmissive member that is configured to transmit the light waves and the reflected light of the light waves; and
    at least one reflection mirror that is arranged further toward a light-emitting unit side and a light-receiving unit side than the transmissive member is, the at least one reflection mirror including at least one reflection surface that rotates, and deflecting at least either of the light waves and the reflected light using the reflection surface, wherein
    the at least one reflection mirror includes a low reflection region on the transmissive member side of the reflection surface, the low reflection region having a reflectance of the light waves on the reflection surface that is set to be lower than a reflectance of the light waves on an other region other than the low reflection region of the reflection surface, in a state in which the reflection surface is facing the light-emitting unit side, the low reflection region and the other region being on the same reflection surface, wherein
    the low reflection region has a greater reflectance as an angle of incidence of incident light increases.

2. The optical scanning apparatus according to claim 1, wherein:
    a dielectric film is further provided in at least the low reflection region.

3. The optical scanning apparatus according to claim 2, wherein:
    the low reflection region further includes a metal film.

4. The optical scanning apparatus according to claim 3, wherein:
    the at least one reflection mirror is configured to deflect at least the light waves emitted from the light-emitting unit.

5. The optical scanning apparatus according to claim 4, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and
    the reflectance in the low reflection region of the second reflection mirror is set to be higher than the reflectance in the low reflection region of the first reflection mirror.

6. The optical scanning apparatus according to claim 3, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and
    the reflectance in the low reflection region of the second reflection mirror is set to be higher than the reflectance in the low reflection region of the first reflection mirror.

7. The optical scanning apparatus according to claim 2, wherein:
    the at least one reflection mirror is configured to deflect at least the light waves emitted from the light-emitting unit.

8. The optical scanning apparatus according to claim 7, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and
    the reflectance in the low reflection region of the second reflection mirror is set to be higher than the reflectance in the low reflection region of the first reflection mirror.

9. The optical scanning apparatus according to claim 2, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and
    the reflectance in the low reflection region of the second reflection mirror is set to be higher than the reflectance in the low reflection region of the first reflection mirror.

10. The optical scanning apparatus according to claim 1, wherein:
    the at least one reflection mirror is configured to deflect at least the light waves emitted from the light-emitting unit.

11. The optical scanning apparatus according to claim 10, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and
    the reflectance in the low reflection region of the second reflection mirror is set to be higher than the reflectance in the low reflection region of the first reflection mirror.

12. The optical scanning apparatus according to claim 1, wherein:
    the at least one reflection mirror is configured to deflect at least the light waves emitted from the light-emitting unit.

13. The optical scanning apparatus according to claim 12, wherein:
    the at least one reflection mirror comprises a first reflection mirror and a second reflection mirror;
    the first reflection mirror is configured to deflect the light waves emitted from the light-emitting unit;
    the second reflection mirror is configured to deflect the reflected light received by the light-receiving unit; and the reflectance in the low reflection region of the second reflection mirror is set to be higher than the reflectance in the low reflection region of the first reflection mirror.

14. The optical scanning apparatus according to claim 1, wherein:
the at least one reflection mirror comprises a first reflection mirror and a second reflection mirror;
the first reflection mirror is configured to deflect the light waves emitted from the light-emitting unit;
the second reflection mirror is configured to deflect the reflected light received by the light-receiving unit; and
the reflectance in the low reflection region of the second reflection mirror is set to be higher than the reflectance in the low reflection region of the first reflection mirror.

15. The optical scanning apparatus according to claim 1, wherein:
the at least one reflection mirror comprises a first reflection mirror and a second reflection mirror;
the first reflection mirror is configured to deflect the light waves emitted from the light-emitting unit;
the second reflection mirror is configured to deflect the reflected light received by the light-receiving unit; and
the reflectance in the low reflection region of the second reflection mirror is set to be higher than the reflectance in the low reflection region of the first reflection mirror.

\* \* \* \* \*